(12) United States Patent
Roohparvar

(10) Patent No.: US 6,614,690 B2
(45) Date of Patent: Sep. 2, 2003

(54) NON-VOLATILE MEMORY HAVING A CONTROL MINI-ARRAY

(75) Inventor: Frankie Fariborz Roohparvar, Milpitas, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/375,477

(22) Filed: Feb. 26, 2003

(65) Prior Publication Data

US 2003/0128590 A1 Jul. 10, 2003

Related U.S. Application Data

(62) Division of application No. 09/928,580, filed on Aug. 13, 2001.

(51) Int. Cl.[7] .............................................. G11C 11/34
(52) U.S. Cl. .................... 365/185.22; 365/201
(58) Field of Search .............................. 365/201, 185.22

(56) References Cited

U.S. PATENT DOCUMENTS

| | | | |
|---|---|---|---|
| 5,801,985 A | 9/1998 | Roohparvar et al. ... | 365/185.01 |
| 5,864,499 A | 1/1999 | Roohparvar et al. ... | 365/185.08 |
| 5,880,996 A | 3/1999 | Roohparvar ........... | 365/185.33 |
| 5,959,445 A * | 9/1999 | Denham .................... | 323/315 |
| 6,141,247 A | 10/2000 | Roohparvar et al. ... | 365/185.08 |
| 6,272,586 B1 | 8/2001 | Roohparvar et al. ........ | 711/103 |
| 6,510,076 B1 * | 1/2003 | Lapadat et al. ............. | 365/154 |
| 6,535,434 B2 * | 3/2003 | Maayan et al. ........ | 365/189.07 |

* cited by examiner

*Primary Examiner*—M. Tran
(74) *Attorney, Agent, or Firm*—Leffert Jay & Polglaze, P.A.

(57) ABSTRACT

A flash memory device having a mini array to store operating parameters. In one embodiment, the flash memory device comprises at least one array block of memory, one or more local latches to store one or more operating parameters and a mini array of non-volatile memory cells. The mini array is used to store the one or more operating parameters. During operation of the flash memory device, the one or more operating parameters are retrieved from the mini array and stored in associated local latches.

10 Claims, 4 Drawing Sheets

NON-VOLATILE MEMORY HAVING A CONTROL MINI-ARRAY

RELATED APPLICATION

This is a divisional application of U.S. patent application Ser. No. 09/928,580 filed Aug. 13, 2001, titled "NON-VOLATILE MEMORY HAVING CONTROL MINI-ARRAY" and commonly assigned, the entire contents of which are incorporated herein by reference.

TECHNICAL FIELD OF THE INVENTION

The present invention relates generally to non-volatile memories and in particular the present invention relates to a flash memory device having a mini array to store operating parameters of the flash memory device.

BACKGROUND OF THE INVENTION

Memory devices are typically provided as internal storage areas in integrated circuit devices. There are several different types of memory. One type of memory is random access memory (RAM). RAM has traditionally been used as main memory in a computer environment. Most RAM is volatile, which means that it requires periodic refresh of electricity to maintain its contents. Another volatile memories include dynamic random access memory (DRAM) and synchronous DRAM (SDRAM). A SDRAM uses a clock pulse to synchronize the transfer of data signals throughout the memory to increase the speed of the memory.

A flash memory is another type of non-volatile memory. A flash memory has its memory array arranged in array blocks of memory cells. Each block can be independently erased with respect to other blocks in the memory array. Typically the memory cells in each block are arranged in row and column fashion. Yet another type of flash memory is a synchronous flash memory. A synchronous flash memory has erasable array blocks and is driven by a clock. In particular, a synchronous flash memory is designed to interface with typical SDRAM systems.

In many memory devices, including flash memory, it is desirable to have the capacity to store certain parameters relating to the operation of the memory. These operating parameters are read and implemented during operation of the memory device. The operating parameters typically relate to voltage levels, timing settings and address redundancy settings. For example, the operating parameters may include program and erase voltage levels or the lengths of erase and soft program pulses. Typically, the operating parameters are transferred to volatile latches and are read and applied during start up or initialization of the device. In the past, fuse elements were used to store these parameters in the local latches. Typically, the manufacture of the memory would blow the fuses permanently. This, however, is limiting because the operating parameters cannot be modified after production.

A memory device having a non-volatile data storage unit in which the operating parameters can be stored and altered at any time after production, is disclosed in U.S. Pat. No. 5,864,499 and is incorporated herein. As disclosed in 5,864, 499, a volatile memory latch circuit and a non-volatile memory device are used to store operating parameters. In this device, non-volatile memory cells in the non-volatile memory device are used as fuses. A limitation of this fuse circuit is the amount of die space required to fabricate and implement the fuse. For each device you typically need two non-volatile cells, a multiplexer and its own sense amplifier.

Another limitation to the fuse circuit is the inability of product and test engineers to gage how well the fuse elements are programmed or erased and forecast data retention time periods.

For the reasons stated above, and for other reasons stated below which will become apparent to those skilled in the art upon reading and understanding the present specification, there is a need in the art for a non-volatile memory device having an improved method of storing operating parameters.

SUMMARY OF THE INVENTION

The above-mentioned problems with non-volatile memory devices and other problems are addressed by the present invention and will be understood by reading and studying the following specification.

In one embodiment, a flash memory device comprising at least one array block of memory, one or more local latches and a mini array is disclosed. The local latches are used to store one or more operating parameters. The mini array also stores the one or more operating parameters in non-volatile memory cells. The one or more operating parameters are retrieved from the mini array and stored in an associated local latch during initialization of the flash memory device.

In another embodiment, a non-volatile memory device comprises a plurality of erasable blocks of flash memory cells, a control array of flash memory cells to store operating parameters, a plurality of local latches to latch operating parameters and control circuitry to control memory operations of the blocks of flash memory cells and the control array. The control circuit reads the operating parameters in the control array and stores the operating parameters in associated local latches.

In another embodiment, a flash memory device comprises a primary array, a secondary array, a plurality of latches and a state machine. The primary array is made up of non-volatile memory cells used to store data. The memory cells in the primary array are arranged in rows and columns. The secondary array is made up of nonvolatile memory cells used to store operating parameters. The memory cells in the secondary array are also arranged in rows and columns. The plurality of local latches are used to latch operating parameters. The state machine is used to control memory operations. During initialization, the state machine reads the operating parameters in the secondary array and stores each operating parameter in an associated local latch.

In another embodiment, a flash memory system comprises a processor to provide external commands, a plurality of memory blocks, a control array to store operating parameters, a plurality of local latches to latch operating parameters and control circuitry. The control circuitry is coupled to control memory operations in the plurality of memory blocks, the control array and the local latches. In addition, the control circuitry is also coupled to receive the external commands from the processor. The control circuitry reads the operating parameters in the control array and stores them in selected local latches during initialization of the flash memory system.

A method of operating a flash memory comprising, reading an operating parameter in a memory cell in a secondary array with a sense amplifier, storing the operating parameter in an associated local latch and implementing the operating parameter during initialization of the flash memory.

Another method of operating a flash memory comprising, starting initialization of the flash memory, addressing a memory cell in a mini array, reading the memory cell in the mini array, storing data read from the memory cell in the mini array to an associated local latch to provide an operating parameter for the flash memory and completing initialization of the flash memory.

A method of setting an operating parameter in a flash memory comprising, applying selective operating parameters to a local latch, implementing the operating parameters in the local latch, monitoring the flash memory for results of the operating parameters and when a desired result is achieved, storing the operating parameter responsible for the desired result in an associated memory cell in a mini array.

A method of testing cell margin of memory cells in a control array that stores operating parameters comprising, varying the control gate voltage of the memory cells in the control array on successive read operations, reading the memory cells after each time the control gate has been varied and determining each cell margin.

A method of testing cell margin of memory cells in a control array that stores operating parameters comprising, varying the sense amplifier trigger timing on successive read operations, reading-the memory cells after each time the trigger timing has been varied and determining each cell margin.

DETAILED DESCRIPTION OF THE INVENTION

In the following detailed description of the preferred embodiments, reference is made to the accompanying drawings, which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims and equivalents thereof.

Figure 1:
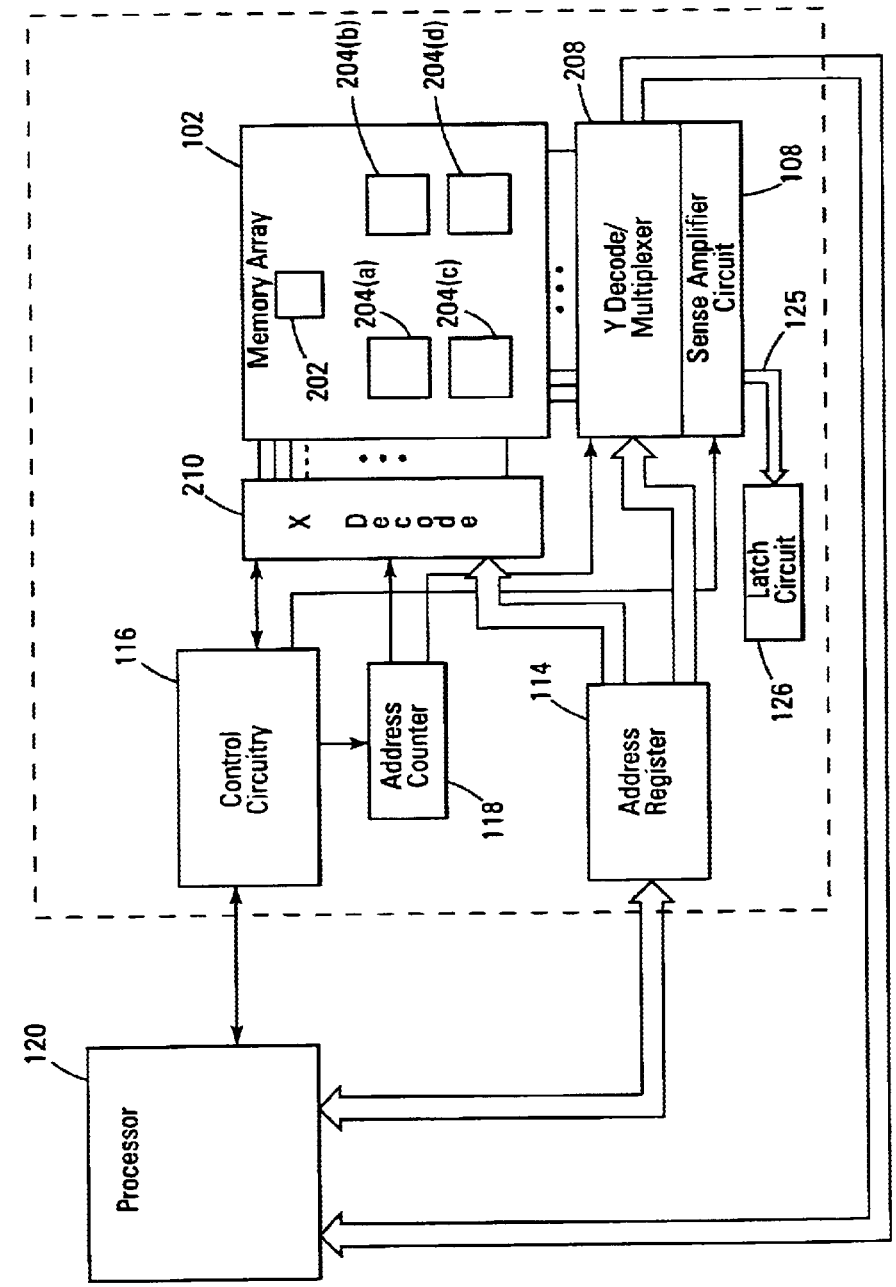
FIG. 1 is a block diagram of one embodiment of the present invention.

Referring to FIG. 1, a simplified block diagram of a flash memory 100 of one embodiment of the present invention is illustrated. It will be appreciated by those in the art, with the benefit of the present description, that FIG. 1 has been simplified to focus on the present invention. As shown, the flash memory 100 has control circuitry 116 to control memory operations to a memory array 102. These memory operations may include reading, writing and erasing. Control circuitry 116 may also be referred to as a state machine 116. The flash memory is also shown having an address register 114, an address counter 118, an X decode circuit 210, a Y decode circuit/multiplexer circuit 208 and a sense amplifier circuit 108. The X decode circuit 210 is used to decode address requests to rows of memory cells in the memory array 102. Although not shown, the X decode circuit 210 may include a multiplexer circuit to combine two or more signals. The Y decode/multiplexer circuit 208 is used to decode and multiplex address requests to columns of memory cells in the memory array 102. Sense amplifier circuit 108 is coupled to read addressed or-accessed memory cells in the memory array 102.

Memory array 102 has four array blocks 204 (a–d) of memory cells, which may be referred to as the primary array 204 (a–d). The memory array 102 is also shown as having a "mini array" 202. The mini array 202 is also referred to herein as a control array 202 or secondary array 202. The mini array 202 is used to store the operating parameters of the flash memory 100. The mini array is coupled to the memory array 102 so as to use the same peripheral circuitry as array blocks 204 (a–d). An external processor 120 is shown coupled to the control circuitry 116 to provide external commands to the flash memory 100. The processor 120 is also coupled to the address register 114 to provide address requests. Although, FIG. 1 is illustrated as having a primary array with four erasable array blocks 204 (a–c) of memory, it will be understood in the art that the primary array could have any number of erasable blocks and the present invention is not limited to primary array's having four erasable memory blocks.

FIG. 1 also shows a latch circuit 126 coupled to receive an output from the sense amplifier circuit 108. The latch circuit 126 contains a plurality of local latches to latch operating parameters. Although, the plurality of local latches are shown as being contained in one area of the flash memory 100 (more specifically, in the latch circuit 126 of FIG. 1), the latches may be spread throughout the flash memory 100 for use in local circuits within the flash memory 100. In operation, upon start up or initialization, the control circuitry 116 directs each cell in the mini array 202 to be read. Operating parameters read from the cells in the mini array 202 are then stored in associated local latches throughout the flash memory 100 for implementation during operation of the flash memory 100. Since, the present invention uses a typical address counter 118 and a typical data bus 125 of a flash memory to store the operating parameters throughout the flash memory 100 in the local latches, overhead is relatively low.

A problem with prior latch based memory devices is encountered when the latch is read at low Vcc levels. That is, the prior memory devices included distributed non-volatile latches that were copied to corresponding volatile latches. This data was transferred when an internal voltage sensing circuit determined that Vcc reached a predetermined level. Accuracy of the voltage sensing circuit, however, was compromised at different operating temperatures. In contrast to prior flash memories that required access when Vcc reached its rated level, one embodiment of the present invention can be implemented in an SDRAM environment. As known to those skilled in the art, an SDRAM has an initialization time following Vcc power-up. The initialization can be based on a time period, or in response to an externally provided initialization signal. As such, Vcc reaches its rated level prior to reading the mini array.

Figure 2:
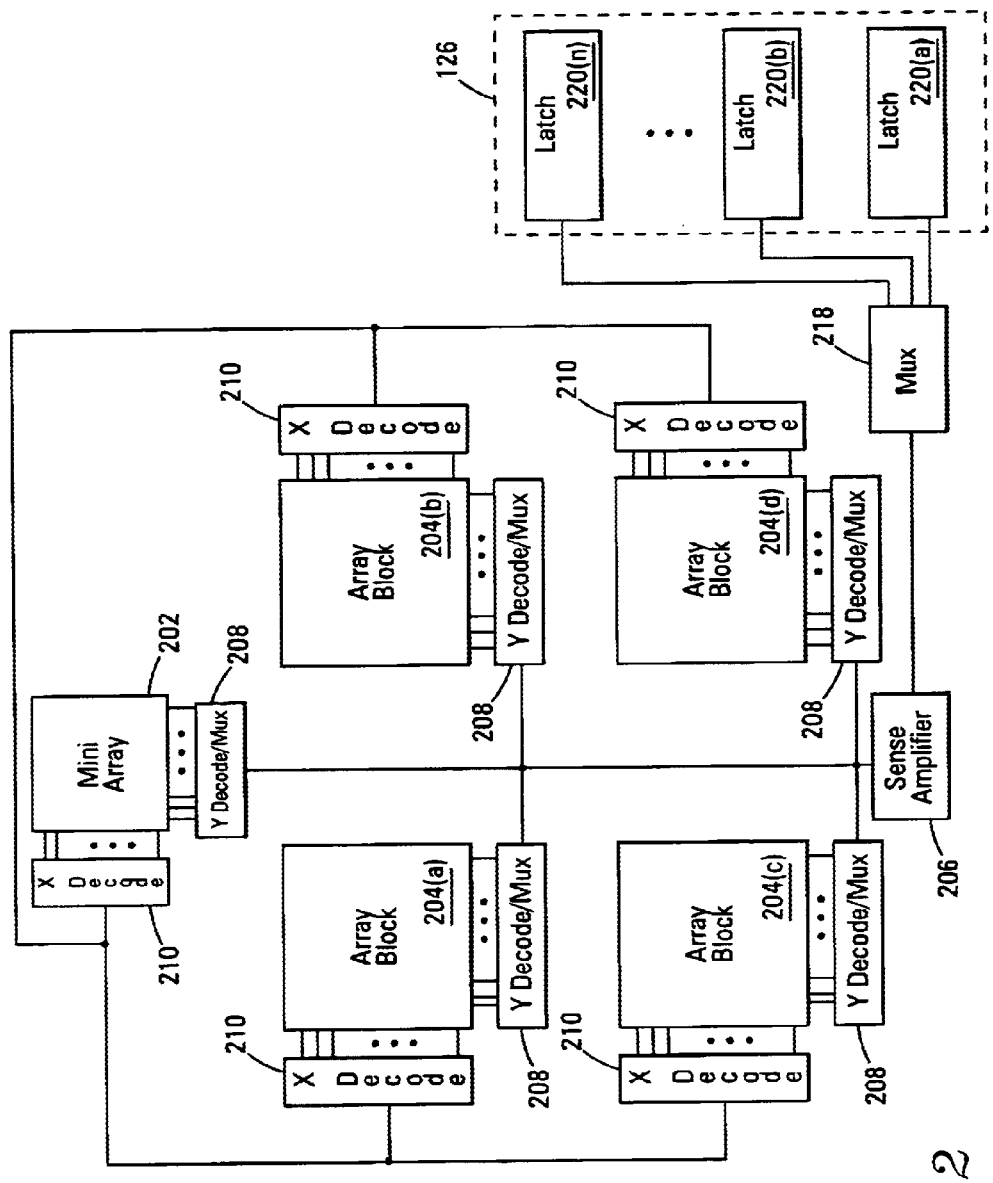
FIG. 2 is a block diagram of one embodiment illustrating how the mini array is coupled to the memory array in one embodiment of the present invention.

Referring to FIG. 2, a block diagram illustrating how the mini array 202 is coupled in the flash memory 100 is shown. As illustrated, array blocks 204(a–d) are coupled to the X decode 210 and the Y decode/multiplexer 208. The mini array 202 is also coupled to the X decode 210 and the Y decode/multiplexer 208. This limits the amount of added elements needed to store and implement the operating parameters. Moreover, sense amplifier 206, used to read the state of addressed cells in the array blocks 204 (a–d), is also used to read the memory cells containing the operating parameters in the mini array 202. As illustrated in FIG. 2, an output of sense amplifier 206 is selectively coupled to one of a plurality of local latches 220 (a–n). In one embodiment, a multiplexer 218 is used to selectively couple the output of the sense amplifier 206 to one or more of the local latches 220 (a-n). An advantage of using sense amplifier 206, as described, is that it creates a very reliable system. In addition, since the mini array 202 is coupled as a normal memory block, the memory is able to use an internal algorithm of the control circuitry 116 to verify if an operating parameter was successfully written to an associated local latch.

Figure 3:
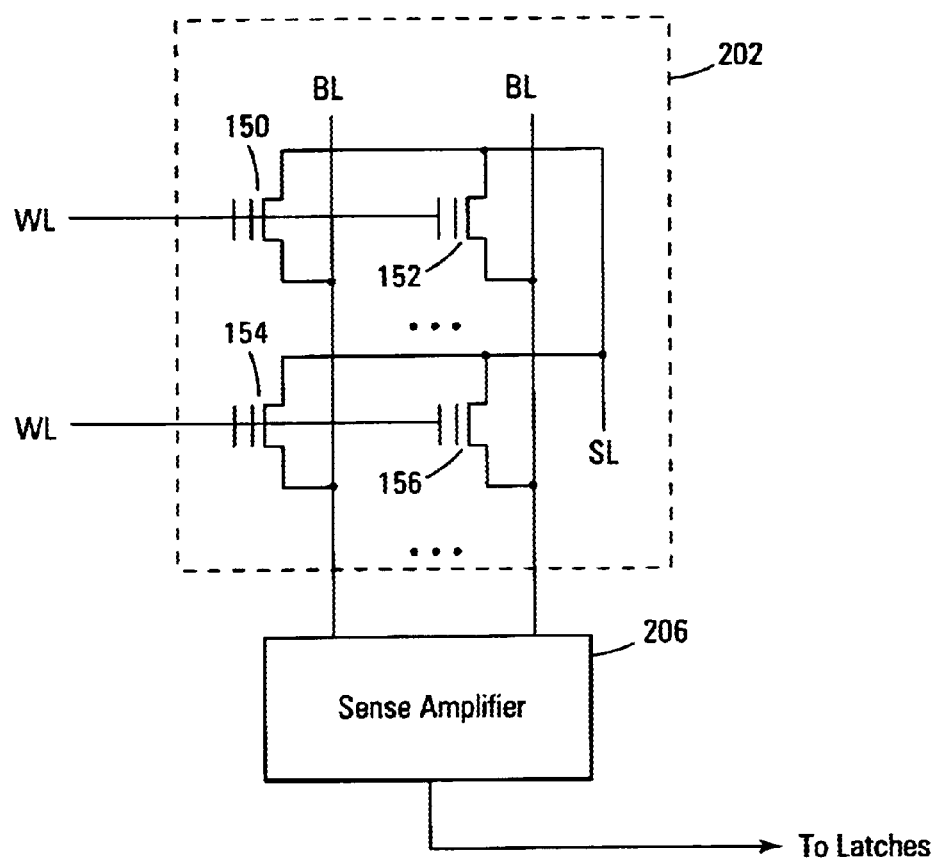
FIG. 3 is a schematic diagram illustrating how memory cells of the present invention are coupled to the senses amplifier circuit.

Referring to FIG. 3, an illustration of how individual memory cells 150, 152, 154 and 156 in the mini array 202 are coupled to sense amplifier 206 is shown. As shown in FIG. 3, word lines WL are coupled to control gates of memory cells 150, 152, 154 and 156 to selectively activate memory cells 150, 152, 154 and 156. A source line SL is also coupled to memory cells 150, 152, 154 and 156. In addition, each memory cell 150, 152, 154 and 156 is coupled to sense amplifier 206 with a respective bit line BL. Sense amplifier 206 may be a current sense amplifier or a voltage sense amplifier. In FIG. 3 only four non-volatile memory cells 150, 152, 154 and 156 are shown. It will, however, be appreciated by those skilled in the art that the mini array 202 could have as many memory cells as there are operating parameters and the mini array 202 of the present invention is not limited to four memory cells.

Figure 4:
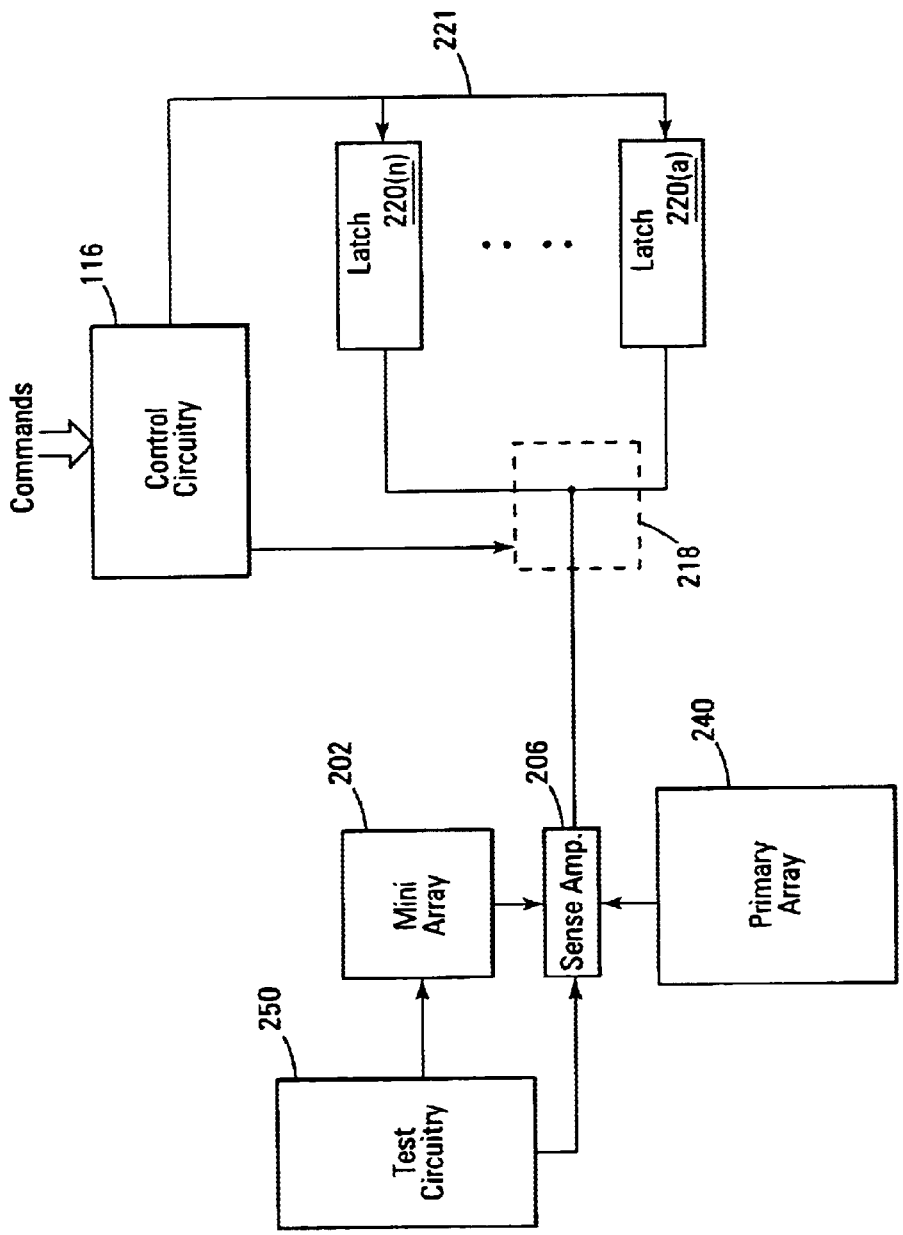
FIG. 4 is a block diagram of one embodiment of the present invention illustrating how operating parameters are tested in local latches.

Local latches 220 (a–n), in the present invention, may also be used in determining the desired operating parameters stored in the mini array 202. This is done by selectively applying different settings to local latches 220 (a–n) and then monitoring their effects on the memory. Once a desired effect is achieved in a local latch, a write operation is used to store the setting to an associated memory cell in the mini array 202 for future use. In one embodiment, an interior bus 221 of the flash memory is used to provide the operating parameter settings. This is illustrated in FIG. 4. As illustrated, the interior bus 221 couples the control circuitry 116 to local latches 220 (a–n). The control circuitry 116 in this embodiment provides the operating parameter settings to local latches 220 (a–n). In another embodiment, an external bus (not shown) is coupled to the local latches!220 (a–n) to provide the operating parameter settings.

The present invention also allows product engineers to conduct margin read test modes on memory cells in the mini array 202. Typically, margin read test modes cannot be done effectively on the fuse systems of the prior art. As known to those in the art, a margin read test mode is performed on a memory cell to predict how it will perform over time. The voltage margin is the actual voltage range between a programmed cell and a sense amplifier trigger level. By knowing the performance shifts over environmental changes and age, the margin read test allows product engineers to forecast data retention. Margin read test modes are also referred to as testing cell margins.

Referring to FIG. 4, one embodiment of the present invention that incorporates test circuitry 250 to conduct margin read test modes is illustrated. As illustrated, external commands are received by the control circuitry 116. Control circuitry 116 is coupled to a plurality of latches 220 (a–n). Control circuitry 116 is also coupled to an optional multiplexer 218. Multiplexer 218 selectively couples each operating parameter that is output from sense amplifier 206 to an associated latch. In addition, sense amplifier 206 is coupled to the primary array 240 to read memory cells. The primary array 240 contains the array blocks 204 (a–d). Test circuitry 250, in this embodiment, is coupled to the mini array 202 to vary word line WL voltage to conduct margin read test modes. In another embodiment, test circuitry 250 is coupled to sense amplifier 206 to vary the sense amplifier 206 trigger timing. This is another way the margin read test modes are conducted.

CONCLUSION

A flash memory device having a mini array to store operating parameters has been disclosed. In one embodiment, the flash memory device comprises at least one array block of memory, one or more local latches to store one or more operating parameters and a mini array of non-volatile memory cells. The mini array is used to store the one or more operating parameters. During operation of the flash memory device, the one or more operating parameters are retrieved from the mini array and stored in associated local latches.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A method for testing cell margin of memory cells in a control array that stores operating parameters comprising:

varying the control gate voltage of the memory cells in the control array on successive read operations;

reading the memory cells after each time the control gate has been varied; and determining each cell margin.

2. The method of claim 1 wherein the control gate voltages are controlled by test circuitry.

3. A method for testing cell margin of memory cells in a control array that stores operating parameters comprising:

varying the sense amplifier trigger timing on successive read operations;

reading the memory cells after each time the trigger timing has been varied; and determining each cell margin.

4. The method of claim 3 wherein the sense amplifier trigger timing is controlled by test circuitry.

5. A method for testing a cell margin of memory cells, of a flash memory device, in a control memory array that stores operating parameters for the device, the method comprising:

receiving a command to initiate the cell margin testing;

varying the sense amplifier trigger timing on successive read operations in response to the command;

reading the memory cells after each time the trigger timing has been varied; and determining each cell margin.

6. The method of claim 5 and further including storing each cell margin in a latch.

7. A flash memory device that tests cell margins, the device comprising:

a control memory array comprising memory cells;

a sense amplifier, coupled to the control memory array, to read the memory cells;

test circuitry, coupled to the control memory array and the sense amplifier, that varies the sense amplifier trigger timing to conduct margin read tests on the memory cells;

a plurality of latches for storing results of the margin read tests;

control circuitry for generating control signals; and a multiplexer, coupled to the sense amplifier and the control circuitry, that selectively couples, in response to the control signals, each margin read test result to an associated latch of the plurality of latches.

8. A flash memory device that tests cell margins of memory cells, the device comprising:

a control array comprising the memory cells, the memory cells storing operating parameters of the device;

means for varying the sense amplifier trigger timing on successive read operations;

means for reading the memory cells after each time the trigger timing has been varied; and means for determining each cell margin.

9. The device of claim 8 and further including means for storing each cell margin.

10. The device of claim 8 and further including:

means for selectively storing each cell margin; and means for controlling the means for selectively storing such that each cell margin is selectively stored.

* * * * *